United States Patent
Mikami et al.

(10) Patent No.: US 9,368,309 B2
(45) Date of Patent: Jun. 14, 2016

(54) ELECTRONIC PART AND ELECTRONIC CONTROL UNIT

(71) Applicants: DENSO CORPORATION, Kariya, Aichi (JP); Murata Manufacturing Co., Ltd., Nagaokakyo-shi, Kyoto-fu (JP)

(72) Inventors: Yuki Mikami, Kariya (JP); Toru Itabashi, Anjo (JP); Ryoichi Shiraishi, Okazaki (JP); Shigeki Nishiyama, Nagaokakyo (JP)

(73) Assignees: DENSO CORPORATION, Kariya (JP); Murata Manufacturing Co., Ltd., Nagaokakyo-shi (JP)

(*) Notice: Subject to any disclaimer, the term of this patent is extended or adjusted under 35 U.S.C. 154(b) by 190 days.

(21) Appl. No.: 14/190,249

(22) Filed: Feb. 26, 2014

(65) Prior Publication Data

US 2014/0240941 A1    Aug. 28, 2014

(30) Foreign Application Priority Data

Feb. 28, 2013   (JP) .................................. 2013-38358

(51) Int. Cl.
| | |
|---|---|
| H05K 1/16 | (2006.01) |
| H01H 85/02 | (2006.01) |
| H05K 1/02 | (2006.01) |
| H05K 1/18 | (2006.01) |
| H05K 3/34 | (2006.01) |
| H01H 85/10 | (2006.01) |

(52) U.S. Cl.
CPC ......... H01H 85/0241 (2013.01); H05K 1/0263 (2013.01); H01H 85/10 (2013.01);

(Continued)

(58) Field of Classification Search
CPC .................. H01H 2085/0275; H01H 85/0241; H01H 85/10; H05K 1/0263; H05K 1/181; H05K 2201/10181; H05K 2201/10946; H05K 3/3426
USPC ........ 361/15, 103, 104, 275.4, 628, 630, 642, 361/646, 738, 766, 783; 337/33, 157, 158, 337/159, 168
See application file for complete search history.

(56) References Cited

U.S. PATENT DOCUMENTS

| | | | | |
|---|---|---|---|---|
| 4,991,059 A | * | 2/1991 | Kiyose | .................. H05K 3/3426 338/329 |
| 6,510,032 B1 | * | 1/2003 | Whitney | .................. H01C 7/13 361/111 |

(Continued)

FOREIGN PATENT DOCUMENTS

| | | |
|---|---|---|
| JP | H02-90507 A | 3/1990 |
| JP | 2006-24825 A | 1/2006 |

(Continued)

OTHER PUBLICATIONS

U.S. Appl. No. 14/190,210, filed Feb. 26, 2014, Itabashi et al.

(Continued)

*Primary Examiner* — Yuriy Semenenko
(74) *Attorney, Agent, or Firm* — Posz Law Group, PLC

(57) ABSTRACT

A main body of an electronic part has multiple electrodes, to which multiple terminals are connected. The terminals include a normal terminal and a fuse terminal, each of which extends from lands formed in a printed board so as to hold the main body at a position above and separated from a board surface of the printed board. The fuse terminal has a cut-off portion having a smaller width than other portions of the fuse terminal, so that the cut-off portion is melted down when excess current flows in the fuse terminal. The normal terminal holds the main body at the position above and separated from the board surface even in a case of melt-down of the cut-off portion.

15 Claims, 9 Drawing Sheets

(52) U.S. Cl.
CPC ........ *H01H2085/0275* (2013.01); *H05K 1/181* (2013.01); *H05K 3/3426* (2013.01); *H05K 2201/10181* (2013.01); *H05K 2201/10946* (2013.01)

(56) References Cited

U.S. PATENT DOCUMENTS

| | | | | |
|---|---|---|---|---|
| 2011/0177387 | A1* | 7/2011 | Byun | H01M 2/04 |
| | | | | 429/178 |
| 2012/0200970 | A1 | 8/2012 | Itabashi et al. | |
| 2015/0235766 | A1* | 8/2015 | Nishiyama | H01G 4/012 |
| | | | | 361/301.4 |

FOREIGN PATENT DOCUMENTS

| | | | |
|---|---|---|---|
| JP | 2006024825 | * | 1/2006 |
| JP | 2007-311467 A | | 11/2007 |

OTHER PUBLICATIONS

U.S. Appl. No. 14/190,250, filed Feb. 26, 2014, Shiraishi et al.
U.S. Appl. No. 14/190,297, filed Feb. 26, 2014, Kamiya et al.
U.S. Appl. No. 14/190,280, filed Feb. 26, 2014, Murowaki et al.
U.S. Appl. No. 14/190,299, filed Feb. 26, 2014, Itabashi et al.

* cited by examiner

SECOND DIRECTION ↑
→ FIRST DIRECTION

ELECTRONIC PART AND ELECTRONIC CONTROL UNIT

CROSS REFERENCE TO RELATED APPLICATION

This application is based on Japanese Patent Application No. 2013-038358 filed on Feb. 28, 2013, the disclosure of which is incorporated herein by reference.

FIELD OF TECHNOLOGY

The present disclosure relates to an electronic part mounted to a printed board and an electronic control unit having the electronic part.

BACKGROUND

A printed board having a pattern fuse, which is a part of wiring patterns formed in the printed board, is known in the art, for example, as disclosed in Japanese Patent Publication No. 2007-311467.

The pattern fuse is generally so formed as to be narrower than a remaining part of the wiring patterns. Therefore, for example, when a short-circuit occurs in an inside of an electronic device or an electronic part and thereby excess current flows, the pattern fuse is melted down due to heat generation in order that an electric pathway is cut off.

In a case of the pattern fuse, it is necessary to individually design the pattern fuses when the pattern fuses are used for different types of electronic parts or when the pattern fuses are used to the same type of the electronic part but ratings of the electronic parts are different from each other. As a result, it is difficult to commonalize or standardize the printed boards for different types of electronic control units. In other words, it is difficult to commonalize the printed boards and to simply change the electronic parts to be mounted to the printed board in order to use the same type of the printed board for the different types of the electronic control units (variation products).

In addition, it is difficult to make a size of the printed board as well as the electronic control unit smaller, because the pattern fuse (or pattern fuses) is formed in the printed board as a part of the wiring patterns.

In addition, since the pattern fuse is formed on a board surface of the printed board, it is a problem that melted-down portions of the pattern fuse may be connected again after the pattern fuse is melted down. In particular, re-connection of the melted-down portions is more likely to occur due to density growth of the printed board.

SUMMARY OF THE DISCLOSURE

The present disclosure is made in view of the above problems. It is an object of the present disclosure to provide an electronic part and an electronic control unit having the electronic part, according to which it is possible to commonalize and/or standardize a printed board, to which the electronic parts are mounted, and to make a size of the printed board smaller. In addition, re-connection of melted-down portion of a fuse portion is prevented.

According to a feature of the present disclosure, an electronic part mounted to a printed board has at least one electronic element and multiple electrodes corresponding to the electronic element. The electronic part has a main body arranged at a position above and separated from a board surface of the printed board. The electronic part further has multiple terminals respectively connected to each of the electrodes at each one end of the terminals and connected to each of lands formed in the printed board at each other end of the terminals, wherein each of the terminals extends from the main body in a direction to the board surface in order to hold the main body at the position above and separated from the board surface in a condition that each of the terminals is electrically connected to the respective electrodes and the respective lands. Each of the terminals has an electrode-connected portion electrically connected to a corresponding electrode of the main body and a land-connected portion electrically connected to a corresponding land formed in the printed board. The terminals include at least one fuse terminal and at least one normal terminal.

The fuse terminal has a cut-off portion, which is formed between the electrode-connected portion and the land-connected portion. A width of the cut-off portion is made smaller than a width of other portions of the fuse terminal. The cut-off portion is so configured to be melted down depending on heat generated at the cut-off portion due to excess current in order to cut off electrical connection between the corresponding electrode and the land.

In the electronic part of the above structure, at least one normal terminal holds the main body at the position above and separated from the board surface when at least one fuse terminal cuts off the electrical connection between the corresponding electrode and the land by melt-down of the cut-off portion.

According to the above structure, the multiple terminals are provided in the electronic part and one of the terminals is composed of the fuse terminal having the cut-off portion. Therefore, it is possible to commonly use the printed boards for different types of electronic control units. In addition, since a pattern fuse is not provided in the printed board, it is possible to reduce a size of the printed board and thereby a size of the electronic control unit by such a volume corresponding to the pattern fuse, which can be eliminated in the present disclosure.

In addition, it is possible to hold the main body by the remaining terminals (other than the fuse terminal melted down) at the position above and separated from the board surface, even when the electrode connected to the fuse terminal is disconnected from the corresponding land due to melt-down of the cut-off portion. It is, therefore, possible to avoid a situation that the main body is inclined with respect to the board surface due to the melt-down of the fuse terminal and that the melted-down portion of the cut-off portion is re-connected.

According to the feature of the present disclosure, the multiple terminals are provided in the electronic part in order to hold the main body at the position above and separated from the board surface by the normal terminal alone.

Since the main body can be held by the normal terminal alone at the position above and separated from the board surface, it is possible to prevent re-connection of the fuse terminal even when all of the cut-off portion is melted down.

According to another feature of the present disclosure, the normal terminal has a first wall portion extending from the land-connected portion to the electrode-connected portion and a second wall portion connected to a horizontal side of the first wall portion in a direction parallel to the board surface. The normal terminal is so formed that the second wall portion is bent by a predetermined angle with respect to the first wall portion, wherein a thickness direction of the second wall portion is different from that of the first wall portion.

According to the above structure, since the thickness directions of the first and second wall portions are different from each other, each of the wall portions works as a joist against vibrational component in different directions. Therefore, the normal terminal is reinforced when compared with a case in which the normal terminal has only the first wall portion. Accordingly, even when external vibration is applied to the electronic part in a condition that the fuse terminal is melted down, at least one of the first wall portion and the second wall portion works as the joist. Therefore, it is possible to stably hold the main body.

BRIEF DESCRIPTION OF THE DRAWINGS

The above and other objects, features and advantages of the present disclosure will become more apparent from the following detailed description made with reference to the accompanying drawings. In the drawings.

DETAILED DESCRIPTION OF THE EMBODIMENTS

Figure 1:
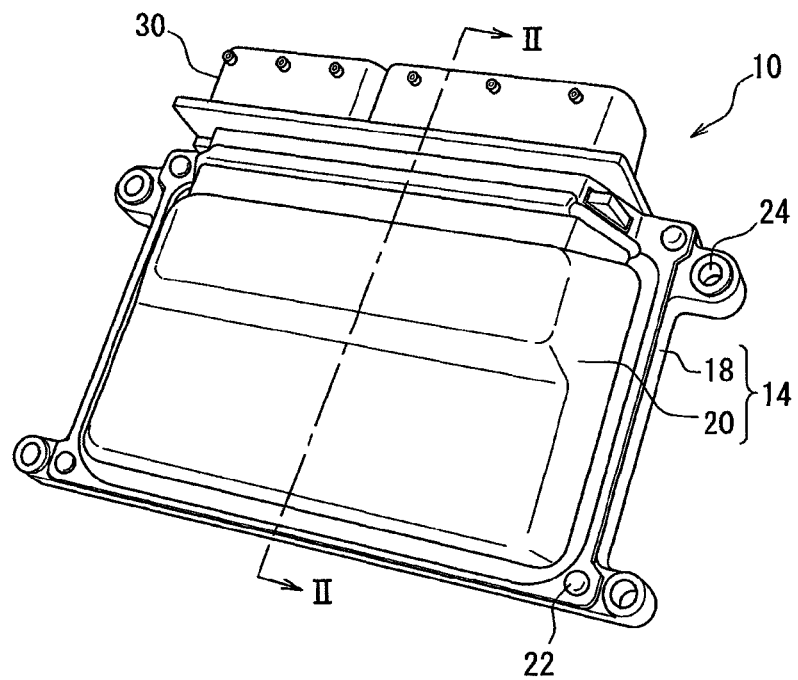
FIG. 1 is a perspective view schematically showing a structure of an electronic control unit according to a first embodiment of the present disclosure.

The present disclosure will be explained hereinafter by way of multiple embodiments. The same reference numerals are given to the same or similar portions and/or structures throughout the embodiments, for the purpose of eliminating repeated explanation.

In the present specification, a direction perpendicular to a board surface of a printed board is referred to as a vertical direction. A direction parallel to the board surface and coinciding with a virtual line connecting opposing electrodes of an electronic part is referred to as a first direction (or an element-longitudinal direction). A direction parallel to the board surface and perpendicular to the first direction is referred to as a second direction (or an element-width direction).

(First Embodiment)

Figure 2:
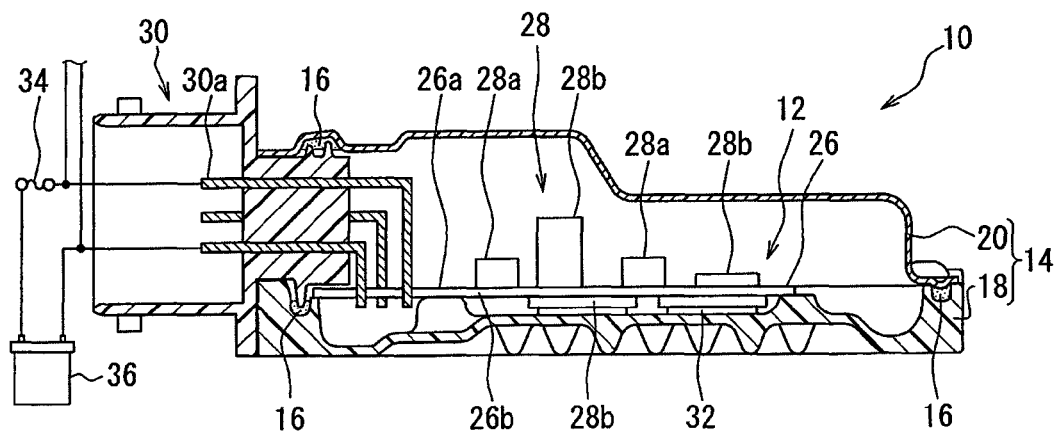
FIG. 2 is a schematic cross sectional view taken along a line II-II in FIG. 1.

An electronic control unit 10 shown in FIGS. 1 and 2 has a circuit board 12 as a main part thereof. The electronic control unit 10 further has a housing 14 for accommodating the circuit board 12 and a seal element 16. In the present embodiment, the electronic control unit 10 is formed as an electronic control unit (ECU) of a water-proof type for controlling an operation of an engine for a vehicle.

An outline structure for the electronic control unit 10 will be hereinafter explained.

The housing 14 is made of metal, such as, aluminum, iron or the like, or resin material, for accommodating therein the circuit board 12 so as to protect the same from water, dust and so on. A number of parts for forming the housing 14 is not limited to a specific number, so that the housing 14 may be composed of one or multiple members.

As shown in FIG. 2, according to the present embodiment, the housing 14 is composed of two parts, that is, a lower casing 18 of a shallow-box shape having an upper open end and an upper casing 20 for closing the upper open end of the lower casing 18. The upper casing 20 is fixed to the lower casing 18 by multiple screws 22 (or bolts) to form an inside space of the housing 14 for accommodating the circuit board 12. In an assembled condition of the housing 14, a portion (or multiple portions) of the circuit board 12 is directly or indirectly interposed between the lower and the upper casings 18 and 20, so that the circuit board 12 is firmly held at a predetermined position inside of the housing 14.

In the present embodiment, the housing 14 is divided into the lower and the upper casings 18 and 20 in the vertical direction (a thickness direction of the circuit board 12). However, a dividing direction for the parts (the lower casing 18 and the upper casing 20) of the housing 14 is not limited to the vertical direction.

Multiple through-holes 24 (four in the present embodiment) are formed at each corner of the lower casing 18 in order that screws or bolts (not shown) are respectively inserted into the through-holes 24 so as to fix the electronic control unit 10 to a predetermined position, for example, to an engine block. An aperture is formed in the housing 14 so that a portion of a connector 30 outwardly protrudes from the inside of the housing 14.

The seal element 16 has a function for preventing water from coming into the inside space of the housing 14. As shown in FIG. 2, the seal element 16 is arranged at a position, at which outer peripheries of the lower and the upper casings 18 and 20 are opposed to each other. The seal element 16 is also arranged at a position, at which the housing 14 and the connector 30 are opposed to each other.

The circuit board 12 is composed of a printed board 26, to which multiple electric or electronic parts and/or components 28 (hereinafter collectively referred to as the electronic parts 28), such as a micro-computer, power transistors, resistors, capacitors and the like are mounted to form electric circuits. The electronic parts 28 are mounted to at least one of board surfaces (a front-side board surface 26a and a back-side board surface 26b) of the printed board 26. In the present embodiment, as shown in FIG. 2, the electronic parts 28 are mounted to both of the board surfaces 26a and 26b of the printed board 26.

For example, multiple electronic parts 28a are mounted to the front-side board surface 26a of the printed board 26, wherein each of the electronic parts 28a has a fuse terminal 56 (FIG. 5), as explained below. The electronic parts 28a correspond to those electronic parts requiring the pattern fuses in a conventional device. The electronic parts other than the electronic parts 28a (having the fuse terminal 56) are designated by 28b (having no fuse terminal) in the drawing, for the sake of convenience.

In addition to the electronic parts 28, the connector 30 is further mounted to the printed board 26 for electrically connecting the electric circuits formed in the circuit board 12 to outside devices (not shown). In FIG. 2, multiple pins 30a of the connector 30 are mounted to the printed board 26 by a through-hole mounting process. However, the pins 30a may be alternatively mounted to the printed board 26 by a surface-mounting process or a surface-mounting structure.

A reference numeral 32 in FIG. 2 designates heat radiation gel arranged between some of the electronic parts 28b and the lower casing 18 and being in contact with them, so as to transfer heat of the electronic parts 28b to the lower casing 18.

In the above-explained electronic control unit 10, an outside connector (not shown) is fitted to the connector 30 (the pins 30a of the connector 30), so that the electronic control unit 10 is electrically connected to a wire harness (not shown). The connector 30 is electrically connected to a battery 36 (a direct current power source) via a main fuse 34 for protecting the electronic control unit 10 from excess current. The battery 36 is also connected to other electronic control units (not shown), such as a brake control ECU, a steering control ECU, a body ECU, a navigation device and so on.

Since the main fuse 34 is provided in a path for supplying electric power necessary for operating the various kinds of the electronic devices, including the electronic control unit 10, a large-size fuse (for example, a fuse element for 15 A, 20 A or the like) is used for the main fuse 34. The main fuse 34 is melted down by the excess current larger than a predetermined value, when any defect or trouble occurs in any one of the electronic devices (including the electronic control unit 10) and thereby the excess current flows through the main fuse 34. Then, the power supply via the main fuse 34 is cut off to prevent an adverse effect to the other electronic devices.

Figure 3:
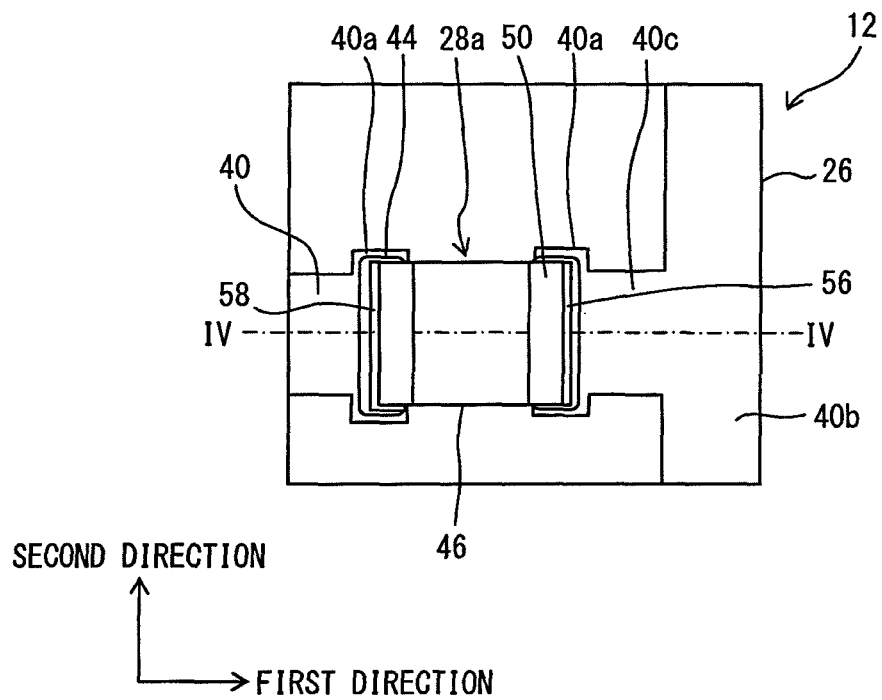
FIG. 3 is a schematically enlarged top plan view showing a portion of a printed board (an electronic part mounted to the printed board)
Figure 4:
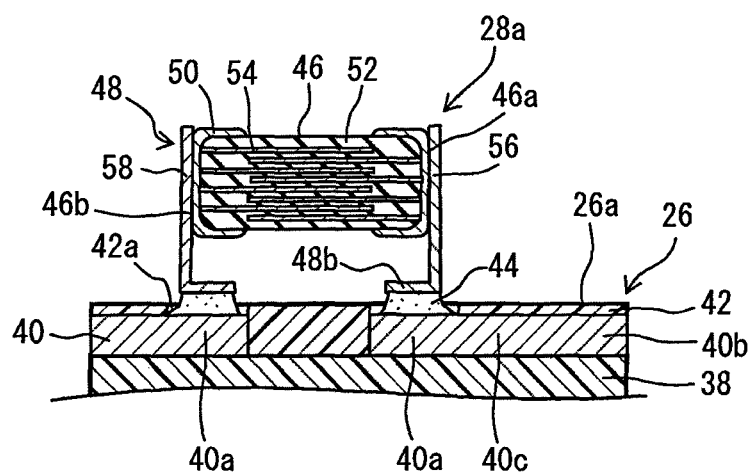
FIG. 4 is a schematic cross sectional view taken along a line IV-IV in FIG. 3.

The circuit board 12, in particular, the electronic part 28a, will be explained more in detail with reference to FIGS. 3 to 8. FIGS. 3 and 4 show relevant portions of the circuit board 12, including one of the electronic parts 28a and portions of the circuit board 12 neighboring to the electronic part 28a mounted to the printed board 26. In FIG. 3, a resist 42 (shown in FIG. 4) is eliminated for the sake of convenience.

The printed board 26 is composed of an insulating board 38 made of resin or ceramics as its main material, and wiring patterns 40 made of conducting material (such as cupper) and arranged on the insulating board 38. Although not shown in the drawing, in the present embodiment, the wiring patterns 40 are formed in a multi-layer structure on the insulating board 38 and the wiring patterns 40 are formed at both board surfaces of the insulating board 38.

The resist 42 is arranged on the board surface of the insulating board 38 (corresponding to the front-side board surface 26a of the printed board 26) so as to cover the wiring patterns 40. The resist 42 has openings 42a at predetermined positions. A portion of the wiring patterns 40, which is exposed to an outside of the printed board 26 via each of the openings 42a, forms a land 40a connected to the electronic part 28a via solder 44.

A resist (42: not shown) is also arranged on the board surface of the insulating board 38 corresponding to the back-side board surface 26b of the printed board 26, so that lands (40a: not shown) are exposed to the outside through respective openings (42a: not shown).

As shown in FIGS. 3 to 6, the electronic part 28a has an electronic-element main body 46 and multiple terminals 48. The electronic-element main body 46 (hereinafter, the main body 46) has at least one electronic element (a capacitor as explained below) and multiple electrodes 50 electrically connected to the electronic element and arranged at outer surfaces of the main body 46. The main body 46 is arranged above the front-side board surface 26a of the printed board 26. In other words, the main body 46 is held at a position which is separated from the board surface (from the front-side board surface 26a in the present embodiment).

In the present embodiment, the main body 46 of the electronic part 28a has only one capacitor as the electronic element (for example, a ceramic-type laminated capacitor). As shown in FIG. 4, the main body 46 of the electronic part 28a (the ceramic-type laminated capacitor) has dielectric layers 52 made of high-dielectric ceramics of a barium-titanate type and electric conductor layers 54, wherein the dielectric layers 52 and the electric conductor layers 54 are alternately laminated in the vertical direction. The electrodes 50 are connected to the electric conductor layers 54. In other words, the electric conductor layers 54 correspond to inside electrodes, while the electrodes 50 correspond to outside electrodes.

Figure 6:
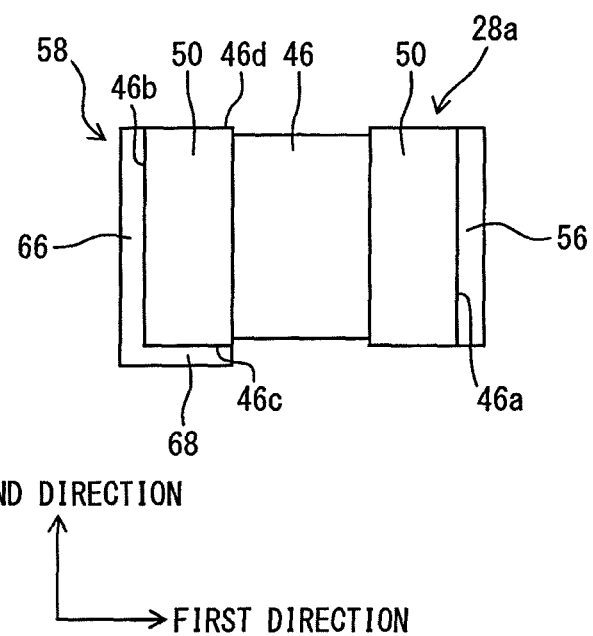
FIG. 6 is a schematic top plan view showing the electronic part.

As shown in FIG. 6, an outer shape of the main body 46 of the electronic part 28a is formed in a rectangular shape on a plane, which is in parallel to the front-side board surface 26a of the printed board 26. The main body 46 has the electrodes 50 at both longitudinal ends in the first direction (in the element-longitudinal direction). Each of the electrodes 50 is formed on the outer surfaces of the main body 46, namely, on a lower-side surface facing to the front-side board surface 26a of the printed board 26, an upper-side surface opposite to the lower-side surface and a side surface (or side surfaces) between the lower-side surface and the upper-side surface. Each of the electrodes 50 is connected to each of the terminals 48 via solder (not shown). The solder for connecting the electrode 50 to the terminal 48 has a higher melting point than the solder 44 for connecting the terminal 48 to the land 40a, so that the solder at the electrodes 50 is not melted down in a reflow soldering process.

Each of the terminals 48 electrically connects the respective electrodes 50 of the electronic part 28a to the corresponding lands 40a. More exactly, as shown in FIG. 6, the main body 46 has four side surfaces 46a, 46b, 46c and 46d (a first side surface 46a to a fourth side surface 46d). Each of the terminals 48 is respectively connected to the first side surface 46a and the second side surface 46b, which correspond to the side surfaces formed at the longitudinal ends of the main body 46. Each of the terminals 48 has an electrode-connected portion 48a connected to the electrode 50 via the solder (not shown) and a land-connected portion 48b connected to the land 40a via the solder 44. Each of the terminals 48 extends from the main body 46 in the vertical direction (in a downward direction toward the printed board 26), so that the multiple terminals 48 support the main body 46 above the front-side board surface 26a (at the position above and separated from the front-side board surface 26a) in a condition that each of the terminals 48 is electrically connected to the respective lands 40a of the printed board 26. One of the terminals 48 corresponds to the fuse terminal 56 having a function for cutting off the excess current, while the other of the terminals 48 corresponds to a normal terminal 58 having no function for cutting off the excess current.

As shown in FIGS. 5 to 8, according to the present embodiment, each of the terminals 48 of a surface-mount type is made of a metal plate by punching out the metal plate in a predetermined two-dimensional shape and bending the punched-out plate to a predetermined three-dimensional shape. In the electronic part 28a, the fuse terminal 56 is connected to the electrode 50 formed at the first side surface 46a, while the normal terminal 58 is connected to the electrode 50 formed at the second side surface 46b.

The multiple terminals 48 (at least one fuse terminal 56 and one normal terminal 58) are provided but the main body 46 can be supported at the position above and separated from the front-side board surface 26a only by the normal terminal 58 in a case that the fuse terminal 56 is melted down. The above supporting function can be realized by a layout of the multiple terminals 48 (including the multiple normal terminals 58) and/or a shape of the normal terminal 58.

Figure 5:
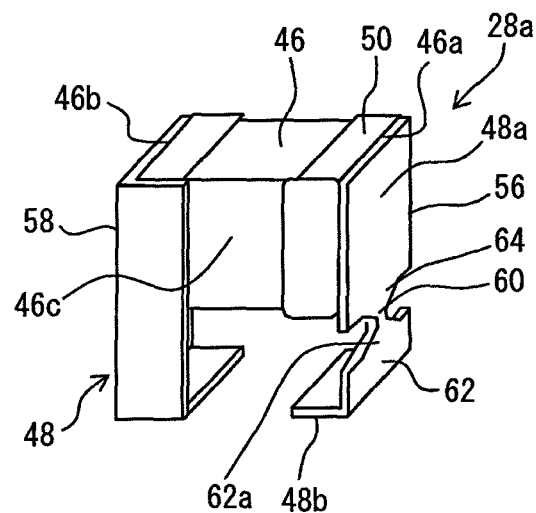
FIG. 5 is a perspective view schematically showing a structure of an electronic part.
Figure 7:
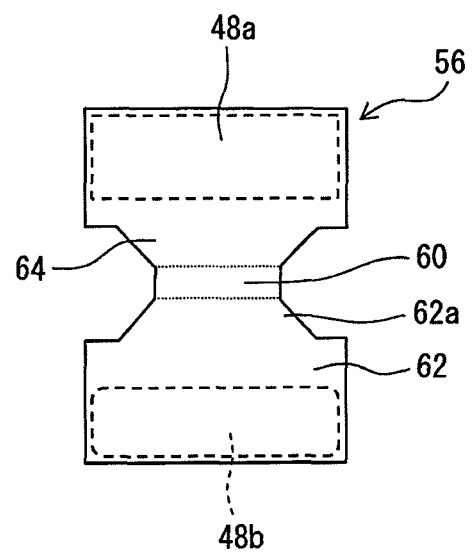
FIG. 7 is a development view schematically showing a structure of a fuse terminal.

The fuse terminal 56 is formed by bending the predetermined shape of the punched-out metal plate to an L-letter shape. As shown in FIGS. 5 and 7, the fuse terminal 56 has a cut-off portion 60 and a large-width portion 62. The cut-off portion 60 is formed at a portion of the fuse terminal 56 between the electrode-connected portion 48a and the land-connected portion 48b and a width of the cut-off portion 60 is made smaller than that of other portions of the fuse terminal 56 (for example, the large-width portion 62). The cut-off portion 60 is melted down depending on the heat generated by the excess current, to thereby cut off the electrical connection between the corresponding electrode 50 and the land 40a. The width of the fuse terminal 56 corresponds to a dimension of the fuse terminal 56 in the second direction (in the element-width direction), which is perpendicular to both of the vertical direction and the first direction (the element-longitudinal direction). The vertical direction corresponds to a direction in which the current flows in the fuse terminal 56, while the first direction (the element-longitudinal direction) corresponds to a thickness direction of the fuse terminal 56. Therefore, the second direction (the element-width direction) is perpendicular to the thickness direction of the fuse terminal 56 but in parallel to the front-side board surface 26a of the printed board 26. The cut-off portion 60 is supported by the fuse terminal 56 (as a part thereof) above the front-side board surface 26a in the condition that the fuse terminal 56 is soldered to the land 40a of the printed board 26.

The large-width portion 62 corresponds to a portion of the fuse terminal 56 between the cut-off portion 60 and one end of the fuse terminal 56 on a side to the land 40a. The large-width portion 62 includes the land-connected portion 48b soldered to the land 40a. At least a part of the large-width portion 62 extends in the vertical direction and is located above the front-side board surface 26a so as to support the cut-off portion 60 at the position, which is above the front-side board surface 26a and separated from the front-side board surface 26a.

As shown in FIG. 7, according to the present embodiment, the fuse terminal 56 has a tapered portion 62a between the cut-off portion 60 and the large-width portion 62, wherein a width of the tapered portion 62a is increased in a direction from the cut-off portion 60 toward the land-connected portion 48b. The large-width portion 62 has a rectangular shape extending from the tapered portion 62a to the land-connected portion 48b, wherein the width of the rectangular portion is larger than a maximum width of the tapered portion 62a. An intermediate portion of the rectangular shape for the large-width portion 62 is bent to form the land-connected portion 48b at one end of the fuse terminal 56. The width of the rectangular portion has a maximum width for the fuse terminal 56.

In addition, the fuse terminal 56 has a connecting portion 64 formed between the cut-off portion 60 and the electrode-connected portion 48a and connecting them to each other. In the present embodiment, the connecting portion 64 is formed in a tapered shape, a width of which is increased in a direction from the cut-off portion 60 toward the electrode-connected portion 48a.

The electrode-connected portion 48a is formed in a rectangular shape having a width larger than a maximum width of the tapered shape of the connecting portion 64. The width of the rectangular shape of the electrode-connected portion 48a is equal to that of the land-connected portion 48b of the large-width portion 62.

A lower end of the fuse terminal 56 bent in the L-letter shape, which is in parallel to the front-side board surface 26a, forms the land-connected portion 48b to be connected to the land 40a. A remaining portion of the fuse terminal 56, which extends in the vertical direction perpendicular to the front-side board surface 26a, is composed of the large-width portion 62 (except for the land-connected portion 48b), the tapered portion 62a, the cut-off portion 60, the connecting portion 64 and the electrode-connected portion 48a. In other words, the portions of the fuse terminal 56 connecting the electrode-connected portion 48a to the land-connected portion 48b extend in the vertical direction, which is perpendicular to the front-side board surface 26a. Therefore, a thickness direction of the portion of the fuse terminal 56 connecting the electrode-connected portion 48a to the land-connected portion 48b corresponds to the thickness direction of the electrode-connected portion 48a.

Figure 8:
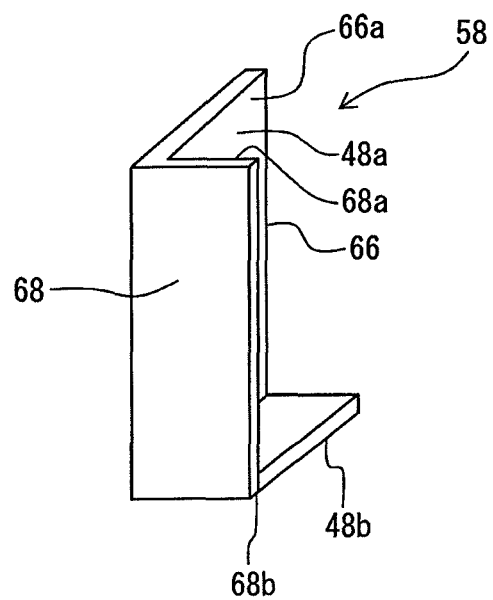
FIG. 8 is a perspective view schematically showing a structure of a normal terminal.

A cross-sectional area of the normal terminal 58 is made to be larger than that of the cut-off portion 60 of the fuse terminal 56 for its entire length of the normal terminal 58. In the present embodiment, the thickness of the normal terminal 58 is made to be equal to that of the fuse terminal 56, while the width of the normal terminal 58 in the second direction is made to be larger than that of the cut-off portion 60 of the fuse terminal 56 for its entire length. The normal terminal 58 is so bent that the normal terminal 58 can stand by itself on the front-side board surface 26a. More exactly, as shown in FIGS. 6 and 8, the normal terminal 58 has a first wall portion 66 and a second wall portion 68, which are formed in a portion of the normal terminal 58 except for the land-connected portion 48b, that is, in the portion extending from the land-connected portion 48b to the electrode-connected portion 48a.

The first wall portion 66 includes the electrode-connected portion 48a as a part thereof. A thickness direction of the first wall portion 66 corresponds to the element-longitudinal direction (the first direction), which is perpendicular to the second side surface 46b of the main body 46. One end portion (an upper end portion) of the first wall portion 66 in the vertical direction forms the electrode-connected portion 48a, while the other end portion (a lower end portion) of the first wall portion 66 is connected to the land-connected portion 48b. In the normal terminal 58 of the present embodiment, a metal plate of a rectangular shape is bent by 90 degrees at a boundary line between the first wall portion 66 and the land-connected portion 48b.

The second wall portion 68 is connected to a side end of the land-connected portion 48b at an angle of 90 degrees and formed in an L-letter shape together with the land-connected portion 48b, so that the second wall portion 68 upwardly extends in the vertical direction from the land-connected portion 48b. A thickness direction of the second wall portion 68 corresponds to the element-width direction (the second direction) extending in parallel to the front-side board surface 26a but extending in a different direction from the first direction.

In the present embodiment, the second wall portion 68 is bent in a direction to an inner surface 66a of the first wall portion 66, which is opposed to the second side surface 46b of the main body 46. The second wall portion 68 is connected to the first wall portion 66 at an angle of 90 degrees. The second wall portion 68 is connected to one of side ends of the first wall portion 66, wherein the side end of the first wall portion 66 extends in the vertical direction perpendicular to the front-side board surface 26a.

As above, in the present embodiment, the normal terminal 58 (the first and second wall portions 66 and 68 except for the land-connected portion 48b) is formed in a V-letter shape, or more exactly in an L-letter shape in a cross section parallel to the front-side board surface 26a. An inner surface 68a of the second wall portion 68, which is connected to the inner surface 66a of the first wall portion 66, is opposed to the third side surface 46c of the main body 46 and electrically connected to the electrode 50 formed on the third side surface 46c by the solder (not shown).

The second wall portion 68 has the same height in the vertical direction to that of the first wall portion 66 and the second wall portion 68 is connected to the first wall portion 66 at its side end for the entire length in the vertical direction. A lower end 68b of the second wall portion 68 terminates at a plane, which is almost equal to a lower side surface of the land-connected portion 48b opposing to the land 40a. The lower end 68b of the second wall portion 68 is connected to the side end of the land-connected portion 48b, as already explained above.

As shown in FIG. 3, the fuse terminal 56 of the electronic part 28a is electrically connected to a power-source wiring pattern 40b via the land 40a and a connecting wiring pattern 40c. The power-source wiring pattern 40b corresponds to a part of the wiring patterns 40, which is commonly used for multiple electronic parts 28 (including the electronic part 28a). The power-source wiring pattern 40b is electrically connected to the battery 36 via the pin 30a of the connector 30.

Advantages of the electronic part 28a and the electronic control unit 10 of the present embodiment will be explained.

In the present embodiment, the electrodes 50 of the electronic part 28a are not directly connected to the lands 40a of the printed board 26 via the solders 44. Instead, the multiple terminals 48 are provided between the electrodes 50 and the lands 40a so that the electrodes 50 are indirectly connected to the lands 40a via the respective terminals 48. In addition, one of the terminals 48 for the electronic part 28a is composed of the fuse terminal 56 having the cut-off portion 60. Accordingly, when short-circuit occurs in the electronic part 28a and thereby the excess current (short-circuit current) flows, the heat is generated depending on the excess current at the cut-off portion 60 having the smaller width. And when temperature at the cut-off portion 60 becomes higher than a predetermined value, the cut-off portion 60 is melted down and the electrical connection between the electrode 50 and the land 40a is cut off. Accordingly, it is possible to quickly cut off the electrical connection between the electrode 50 and the land 40a (which are connected to each other by the fuse terminal 56 before the melt-down) when the excess current flows through the fuse terminal 56.

As above, the function for cutting off the excess current (the short-circuit current) caused by the short-circuit fault of the electronic part 28a is realized not by a pattern fuse formed in the printed board 26 but by the fuse terminal 56 for the electronic part 28a. As a result, it becomes possible to commonalize and/or standardize the printed boards 26, which can be commonly used for the different types of the electronic control units. Therefore, it is possible to provide variation products, for which the same printed boards 26 can be used but different electronic parts 28a are mounted to the printed board 26.

In addition, it is possible to make the size of the printed board 26 as well as the electronic control unit 10 smaller by such a volume corresponding to the pattern fuse, which is not necessary in the present embodiment.

The normal terminal 58 has not only the first wall portion 66 but also the second wall portion 68, wherein the thickness directions of those wall portions 66 and 68 are different from each other. Each of the wall portions 66 and 68 has a function as a joist in its wall extending direction in parallel to the board surface 26a. More exactly, the second wall portion 68 works as the joist against a vibrational component in the first direction (in the element-longitudinal direction), while the first wall portion 66 works as the joist against a vibrational component in the second direction (in the element-width direction). Thus, the normal terminal 58 is more reinforced than such a terminal having only one wall portion (for example, only the first wall portion 66).

Accordingly, it is possible to prevent the normal terminal 58 from being bent and to prevent melted-down portions of the fuse terminal 56 from being re-connected, even when the fuse terminal 56 is melted down. In addition, even when any vibrating force is applied to the electronic part 28a in a condition that the fuse terminal 56 is melted down, it is possible to stably support the main body 46 because each of the first and second wall portions 66 and 68 works as the joist. It is thereby possible to improve safeness of the electronic part 28a for preventing the re-connection of the fuse terminal 56 melted down.

According to the present embodiment, even when the electrical connection for the electrode 50 connected to the fuse terminal 56 is cut off from the corresponding land 40a by the melt-down of the cut-off portion 60, it is possible to support the main body 46 by the remaining terminal 48 (not including the melted-down fuse terminal 56) so that the main body 46 is continuously held at the position above and separated from the front-side board surface 26a. It is, therefore, possible to prevent the main body 46 from being inclined with respect to the board surface 26a due to the melt-down of the fuse terminal 56 and thereby to prevent the cut-off portion 60 (which is melted down) from being re-connected. As a result, it is possible to prevent a trouble that the excess current may flow again.

In the present embodiment, since it is possible to support the main body 46 at the position above and separated from the front-side board surface 26a by the normal terminal 58 alone, it is possible to prevent the re-connection after the fuse terminal 56 is melted down. In other words, it is possible to improve the safeness for the re-connection of the melted-down portions.

In the present embodiment, each of the electrodes 50 is respectively provided at the first side surface 46a and the second side surface 46b, which are located at the longitudinal ends of the main body 46 in the element-longitudinal direction (the first direction). The fuse terminal 56 is connected to the electrode 50 formed at the first side surface 46a, while the normal terminal 58 is connected to the electrode 50 formed at the second side surface 46b. The element-longitudinal direction (the first direction) corresponds to the direction perpendicular to the second side surface 46*b*. According to the above structure, when the fuse terminal 56 is melted down, one end of the fuse terminal 56 is likely to be displaced in the vertical direction and thereby the main body 46 is likely to be inclined with respect to the board surface 26*a*. However, according to the present embodiment, the second wall portion 68 works as the joist for preventing the inclination of the main body 46. Therefore, it is possible to stably support and hold the main body 46 above the board surface 26*a*.

In addition, the cut-off portion 60 is held at the position separated from the front-side board surface 26*a* of the printed board 26, in the condition that the fuse terminal 56 is connected to the land 40*a*. Therefore, the heat at the cut-off portion 60 is not directly transferred to the printed board 26.

In addition, at least a part of the large-width portion 62 for supporting the cut-off portion 60 is arranged at the position above and separated from the front-side board surface 26*a*. The heat at the cut-off portion 60 is not easily transferred to the printed board 26 via the large-width portion 62. It is, therefore, possible to shorten a time period from the short-circuit fault of the electronic part 28*a* to the melt-down of the cut-off portion 60. In other words, it is possible to improve response.

In a case that the response is improved by the pattern fuse, it is necessary to make the pattern fuse thinner than other portions of the wiring patterns or to make the pattern fuse with such material which is more easily melted down than the other portions of the wiring patterns. However, the above method increases manufacturing cost.

According to the present embodiment, since the heat of the cut-off portion 60 is not easily transferred to the printed board 26, it is possible not only to improve the response but also to reduce the manufacturing cost. Furthermore, since the heat of the cut-off portion 60 is not easily transferred to the printed board 26, it is possible to loosen up designing of heat-resisting performance for the printed board 26. The manufacturing cost is correspondingly further reduced.

In the printed board having the pattern fuses, heat generated at electronic parts neighboring to one pattern fuse and/or heat generated at other pattern fuses adjacent to the one pattern fuse is transferred to the one pattern fuse via the insulating board and the wiring patterns. Since the pattern fuse is influenced by the heat generated at portions surrounding the pattern fuse, the pattern fuse may be melted down before the short-circuit fault occurs in the electronic part, in a case of a high-density packaging.

According to the present embodiment, however, since the cut-off portion 60 is held at the position above and separated from the board surface of the printed board 26, the cut-off portion 60 is not easily influenced by the heat of the other electronic parts 28. It is, therefore, possible to realize the high-density packaging. In other words, the size of the printed board 26 can be reduced and thereby the manufacturing cost can be correspondingly reduced.

In the electronic control unit 10, at least some of the multiple electronic parts 28*a* having the fuse terminals 56 are connected to the power-source wiring pattern 40*b* via the lands 40*a* and the connecting wiring patterns 40*c*. As already explained above, when the short-circuit fault occurs in one of the electronic parts 28*a* and the excess current flows in the fuse terminal 56, the connection between the electrode 50 and the land 40*a* is immediately cut off by the melt-down of the cut-off portion 60 of the fuse terminal 56 (which has connected the electrode 50 and the land 40*a* before the melt-down). Accordingly, it is possible to protect the other electronic parts 28 connected to the power-source wiring pattern 40*b* from the excess current.

The excess current flowing in the fuse terminal 56 for cutting off the cut-off portion 60 is not so large as the excess current for cutting off the main fuse 34. Therefore, it is possible to suppress adverse influence, which may be caused by the excess current flowing in the fuse terminal 56, to power-supply to the other electronic devices.

In the present embodiment, the electronic part 28*a* includes the ceramic-type laminated capacitor. In a case that the electronic part 28*a* of the laminated structure is used, the size of the electronic part 28*a* can be made smaller and the high-density packaging for the printed board 26 can be realized. However, on the other hand, the electronic part having the laminated structure may have a problem that the electric conductor layers 54 (which are laminated in multiple layers) are likely to be short-circuited by vehicle vibration and/or heat stress. In the present embodiment having the electronic part 28*a* of the laminated structure, however, it is possible to rapidly cut off the electrical connection between the electrode 50 and the land 40*a*, if the short-circuit fault occurs.

The battery of a lithium system is more advantageous than a lead battery in view of power supplying capability. On the other hand, the lithium battery has such a disadvantage that it will be quickly deteriorated when current larger than a rated output current is supplied to electric loads. According to the present embodiment, however, the electrical connection between the electrode 50 and the land 40*a* is immediately cut off by the fuse terminal 56 in the case of short-circuit in the electronic part 28*a*. It is, therefore, possible to suppress adverse influence to the battery to a minimum value.

(Second Embodiment)

A second embodiment of the present disclosure will be explained with reference to FIGS. 9 and 10. Explanation for those portions, which are similar to or the same to those of the first embodiment (including the electronic part 28*a*, the electronic control unit 10 and so on), will be omitted.

Figure 9:
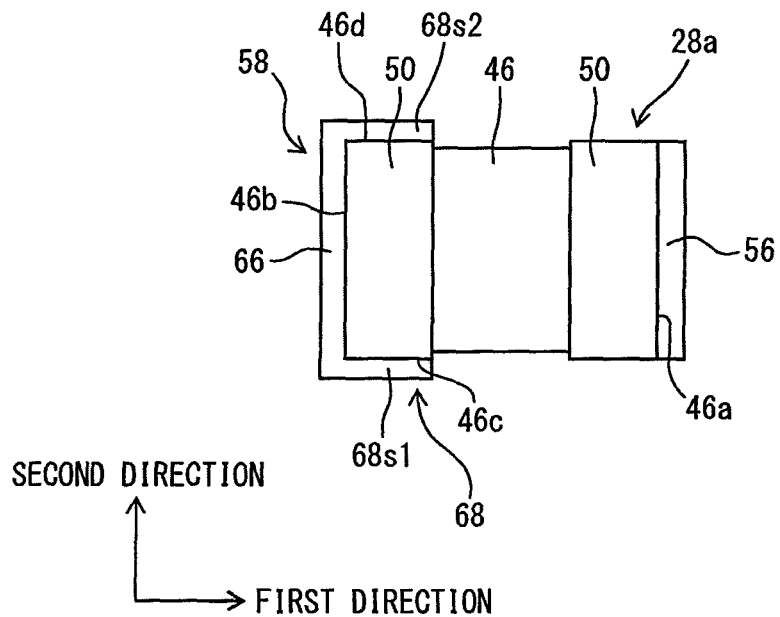
FIG. 9 is a schematic top plan view showing an electronic part, which is used in an electronic control unit according to a second embodiment.
Figure 10:
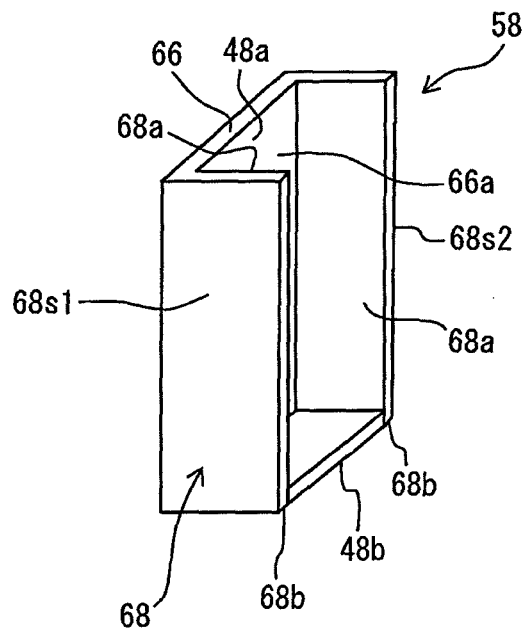
FIG. 10 is a perspective view schematically showing a structure of a normal terminal for the electronic part of the second embodiment.

As shown in FIGS. 9 and 10, the second embodiment differs from the first embodiment in that the normal terminal 58 has a pair of second wall portions 68 at both sides of the first wall portion 66 in the element-width direction (the second direction). One of the second wall portions 68 is designated by 68*s*1 (a first part of the second wall portions 68), while the other is designated by 68*s*2 (a second part of the second wall portions 68).

The first part 68*s*1 of the second wall portions 68 corresponds to the second wall portion 68 of the first embodiment. The second part 68*s*2 of the second wall portions 68 is provided at the horizontal side of the first wall portion 66 opposite to that for the first part 68*s*1 in the second direction.

The second part 68*s*2 is also inwardly bent at the horizontal side by almost 90 degrees with respect to the inner surface 66*a* of the first wall portion 66, like the first part 68*s*1. The normal terminal 58, except for the land-connected portion 48*b*, has a cross section of a U-letter shape on a plane defined by the first and second directions. The inner surface 68*a* of the second part 68*s*2 connected to the inner surface 66*a* of the first wall portion 66 is opposed to the fourth side surface 46*d* of the main body 46 and electrically connected to the electrode 50 formed at the fourth side surface 46*d* by solder (not shown).

The second part 68*s*2 has the same height in the vertical direction to that of the first wall portion 66 and the second part 68*s*2 is connected to the horizontal side of the first wall portion 66 for its entire length. A lower end 68*b* of the second part 68*s*2 terminates at the plane, which is almost equal to the lower side surface of the land-connected portion 48*b* opposing to the land 40*a*. The lower end 68*b* of the second part 68*s*2 is connected to another horizontal side of the land-connected portion 48*b*.

According the above structure, the normal terminal 58 has two second wall portions 68 (68s1, 68s2) working as the joists against the vibrational component in the first direction. When compared with the case (the first embodiment) having one second wall portion, it is possible to more effectively prevent the fuse terminal 56 from being displaced in the direction toward the front-side board surface 26a and to prevent the main body 46 from being inclined, when the fuse terminal 56 is melted down. As above, it is possible to more stably support the main body 46 by the normal terminal 58 and thereby it is possible to effectively prevent the melted-down portions from being re-connected.

In addition, since the normal terminal 58 has the pair of second wall portions 68 (68s1, 68s2) at both horizontal sides of the first wall portion 66, the normal terminal 58 is not likely to get distorted in both of the first direction and the second direction. Therefore, the main body 46 can be further stably supported.

(Third Embodiment)

A third embodiment of the present disclosure will be explained with reference to FIGS. 11 and 12. Explanation for those portions, which are similar to or the same to those of the first embodiment (including the electronic part 28a, the electronic control unit 10 and so on), will be omitted.

Figure 11:
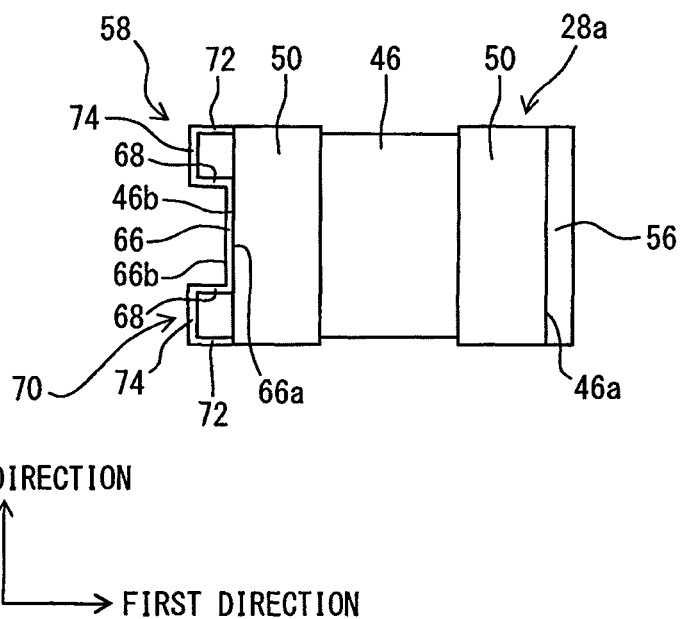
FIG. 11 is a schematic top plan view showing an electronic part, which is used in an electronic control unit according to a third embodiment.
Figure 12:
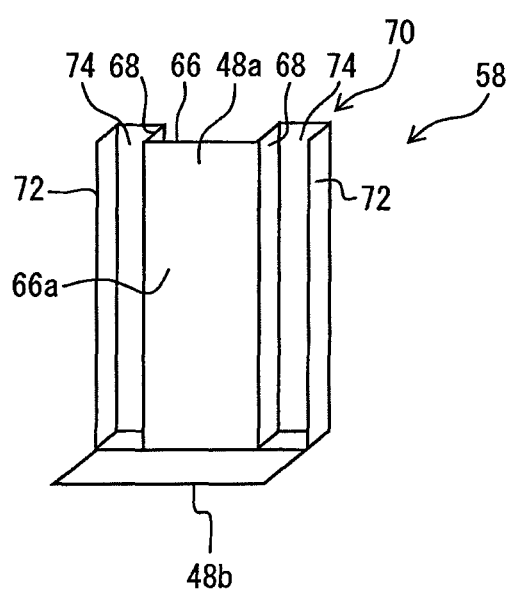
FIG. 12 is a perspective view schematically showing a structure of a normal terminal for the electronic part of the third embodiment.

As shown in FIGS. 11 and 12, the normal terminal 58 has a pair of convex portions 70 at both sides of the first wall portion 66 in the element-width direction (the second direction). Each of the convex portions 70 has the second wall portion 68 (as a part of the convex portion 70) extending from the first wall portion 66 in the element-longitudinal direction (the first direction) opposite to the fuse terminal 56.

Each of the convex portions 70, which are provided at both sides of the first wall portion 66 in the second direction, outwardly protrudes on a side of an outer surface 66b of the first wall portion 66, that is, in the first direction opposite to the main body 46. Each of the convex portions 70 is opposed to the second side surface 46b of the main body 46.

Each of the convex portions 70 has a cross section of a U-letter shape and is composed of the second wall portion 68, a third wall portion 72 and a fourth wall portion 74, wherein the second and the third wall portions 68 and 72 are opposed to each other in the second direction with a space between them. The fourth wall portion 74 is provided between the second and the third wall portions 68 and 72 for connecting them together.

The third wall portion 72 is so arranged as to be in parallel to the second wall portion 68. A thickness direction of the third wall portion 72 corresponds to the second direction. The third wall portion 72 has a width (in the first direction) and a height (in the vertical direction), which are substantially the same to those of the second wall portion 68.

The fourth wall portion 74 is so arranged as to be in parallel to the first wall portion 66. A thickness direction of the fourth wall portion 74 corresponds to the first direction. The fourth wall portion 74 has the same height in the vertical direction to those of the second and the third wall portions 68 and 72. One horizontal side of the fourth wall portion 74 in the second direction is connected to one horizontal side of the second wall portion 68, which is an opposite side to the first wall portion 66, for its entire length in the vertical direction, while the other horizontal side of the fourth wall portion 74 is connected to one horizontal side of the third wall portion 72 for its entire length in the vertical direction.

According the above structure, the normal terminal 58 has not only the second wall portion 68 but also the third wall portion 72, both of which work as the joists against the vibrational component in the first direction. In addition, the normal terminal 58 has not only the first wall portion 66 but also the fourth wall portion 74, both of which work as the joists against the vibrational component in the second direction. Since the normal terminal 58 is reinforced as above, it is possible to prevent the normal terminal 58 from being bent and to prevent the fuse terminal 56 from being re-connected, when the fuse terminal 56 is melted down. In addition, it is possible to more stably support the main body 46 even when any vibration is applied from the outside to the main body 46 in a condition that the fuse terminal 56 is melted down, because at least one of the first wall portion 66 and the fourth wall portion 74 and/or at least one of the second wall portion 68 and the third wall portion 72 work as the joists, depending on the direction of the vibrational component applied to the main body 46.

In the present embodiment, the convex portion 70 has the second wall portion 68, the third wall portion 72 and the fourth wall portion 74. However, the structure of the convex portion 70 should not be limited to the above-explained structure (the U-letter shape). The convex portion may be so modified that the convex portion has at least a second wall portion, a thickness direction of which is different from that of the first wall portion 66 and which outwardly protrudes from the first wall portion 66. Furthermore, a number of the convex portions should not be limited to the number (two) of the present embodiment. The number may be one or more than two.

The present disclosure should not be limited to the above embodiments but can be modified in various manners without departing from the spirits of the present disclosure.

(First Modification)

Figure 13:
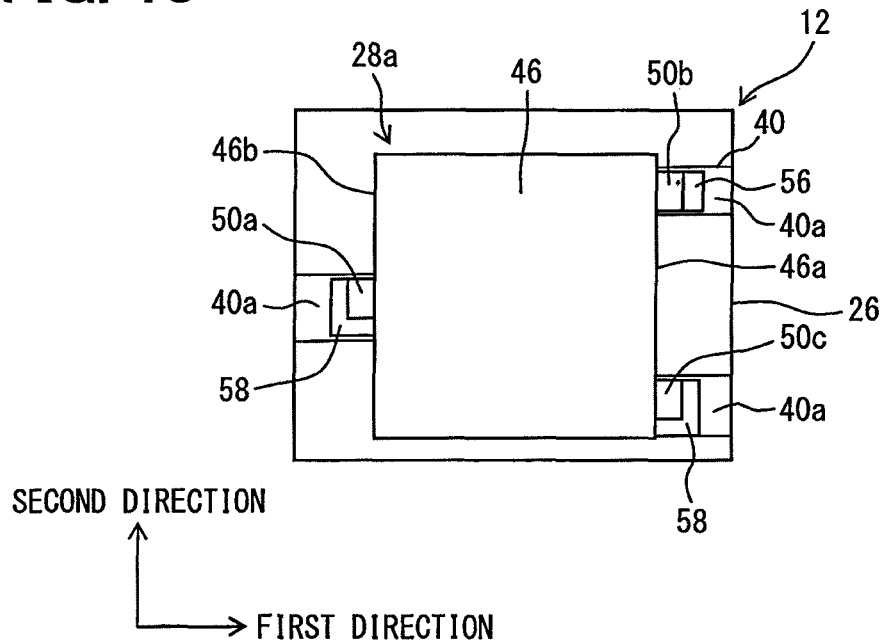
FIG. 13 is a schematic top plan view showing an electronic part according to a first modification.

A number of the electrodes 50 of the electronic part 28a should not be limited to two. In FIG. 13, the electronic part 28a is composed of a transistor having three electrodes 50a, 50b and 50c. The electrode 50a formed at the second side surface 46b is a drain electrode, the electrode 50b formed at a part of the first side surface 46a is a source electrode and the electrode 50c also formed at another part of the first side surface 46a is a gate electrode. The fuse terminal 56 is connected to the source electrode 50b, while the normal terminals 58 are respectively connected to the drain electrode 50a and the gate electrode 50c. In FIG. 13, the normal terminal 58 has the same structure to that of the first embodiment.

According to the above structure, when the transistor formed in the main body 46 has a malfunction and thereby the excess current flows in an electric path between the drain and the source electrodes 50a and 50b, the cut-off portion 60 of the fuse terminal 56 connected to the source electrode 50b is melted down to thereby cut off the excess current. Even when the fuse terminal 56 is melted down, it is possible to hold the main body 46, by the remaining terminals 48 (that is, the normal terminal 58 connected to the electrode 50a and the normal terminal 58 connected to the electrode 50c), at the position above and separated from the front-side board surface 26a.

It is also possible to connect the fuse terminal 56 to the drain electrode 50a and connect the normal terminal 58 to the source electrode 50b. However, in the case that two normal terminals 58 are respectively connected to the electrodes 50a and 50c, as shown in FIG. 13, which are formed at both side surfaces (opposing to each other) of the main body 46, it is possible to more stably support the main body 46.

It is furthermore possible to connect the fuse terminal 56 to the gate electrode 50c and connect the normal terminals 58 to the drain electrode 50a and the source electrode 50b. In addition, the normal terminals 58 of the second or the third embodiment can be used in the modification of FIG. 13.

(Second Modification)

In the above embodiments, the normal terminal 58 has the first wall portion 66 and the second wall portion 68. However, when the multiple terminals (more than two) are provided, it is not always necessary to provide the second wall portion 68 depending on a layout of such multiple terminals.

Figure 14:
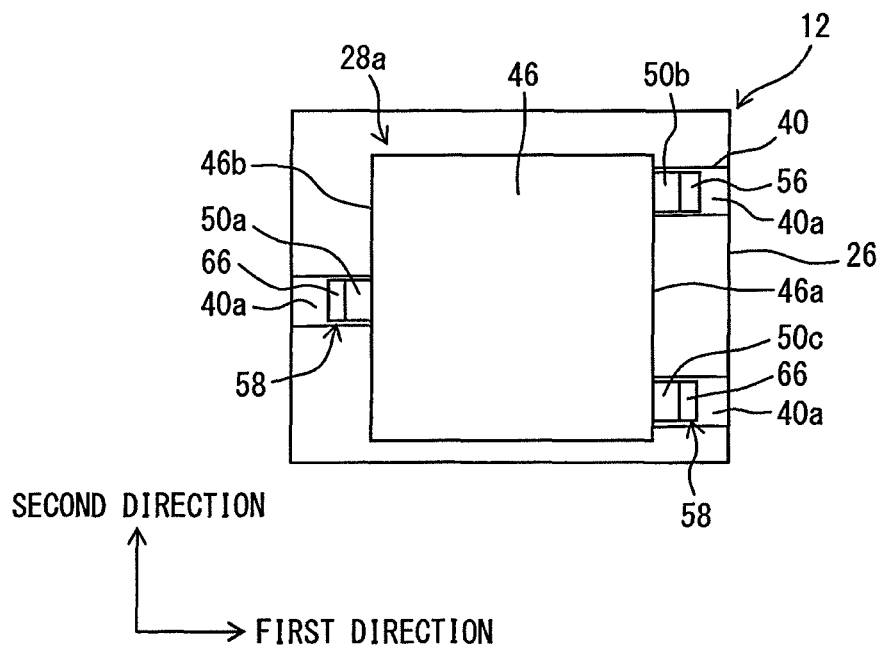
FIG. 14 is a schematic top plan view showing an electronic part according to a second modification.

For example, as shown in FIG. 14, the normal terminals 58 are respectively connected to the electrodes 50a and 50c. Each of the normal terminals 58 has a structure similar to that of the first embodiment and the normal terminal 58 does not have a structure corresponding to the second wall portion 68. In other words, the normal terminal 58 has only the first wall portion 66 and the land-connected portion 48b. The structure of FIG. 14 is the same to that of FIG. 13, except for the above point.

According to the above structure, since the normal terminals 58 are respectively connected to the electrodes 50a and 50c, which are formed at the first and second side surfaces 46a and 46b opposing to each other in the first direction, it is possible to stably support the main body 46 at the position above the front-side board surface 26a, even when the fuse terminal 56 connected to the electrode 50b is melted down.

(Third Modification)

Figure 15:
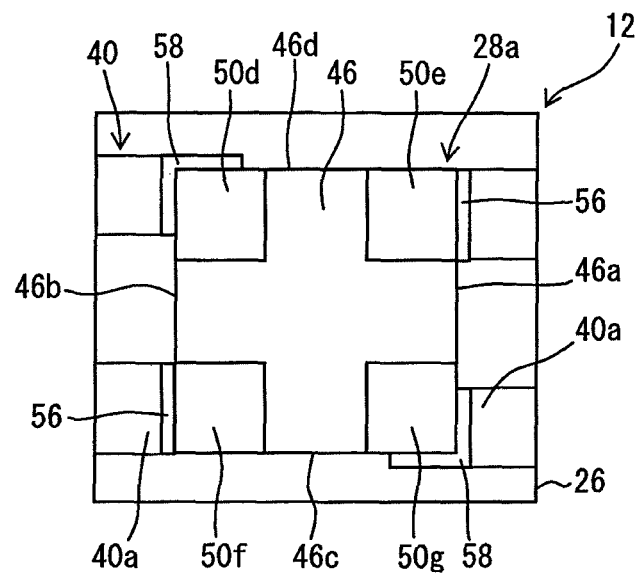
FIG. 15 is a schematic top plan view showing an electronic part according to a third modification.

In the above embodiments, the main body 46 includes one electronic element. However, the main body 46 may include multiple electronic elements. A resister, a diode or the like is known as the electronic part 28a, the main body 46 of which has multiple electronic elements. In FIG. 15, a multiple-chip resistor having two resistors is shown as an example of the electronic part 28a.

The electronic part 28a has four electrodes 50d to 50g for two resistors. The electrodes 50d and 50e correspond to the electrodes 50 for one of the resistors, while the electrodes 50f and 50g correspond to the electrodes 50 for the other of the resistors. Each of the electrodes is formed at each corner of the main body 46 having a rectangular shape. More in detail, the electrode 50d is formed at the second side surface 46b and the fourth side surface 46d, while the electrode 50e is formed at the first side surface 46a and the fourth side surface 46d. The electrode 50f is formed at the second side surface 46b and the third side surface 46c, while the electrode 50g is formed at the first side surface 46a and the third side surface 46c.

The fuse terminals 56 are respectively connected to the electrodes 50e and 50f which are diagonally arranged, while the normal terminals 58 are respectively connected to the electrodes 50d and 50g which are also diagonally arranged.

According to the above structure, in a case that one of the resistors breaks down and thereby the fuse terminal 56 connected to the electrode 50e is melted down, the remaining three terminals 56 and 58 support the main body 46 at the position above the board surface. In a similar manner, when the other of the resistors breaks down and the fuse terminal 56 connected to the electrode 50f is melted down, the remaining three terminals 56 and 58 can support the main body 46 above the board surface.

In addition, even when both of the resistors break down and the fuse terminals 56 connected to the electrodes 50e and 50f are melted down, the remaining two normal terminals 58 diagonally arranged can support the main body 46 above the board surface. In particular, in the example shown in FIG. 15, since each of the normal terminals 58 has the first and second wall portions 66 and 68, it is possible to more stably support the main body 46 by the normal terminals 58 alone.

In FIG. 15, the fuse terminals 56 may be alternatively connected to the electrodes 50d and 50f, while the normal terminals 58 may be connected to the electrodes 50e and 50g. However, when the normal terminals 58 are diagonally arranged, as shown in FIG. 15, it is possible to more stably support the main body 46. The normal terminals 58 of the second and/or third embodiments may be used for the electronic part 28a of FIG. 15.

(Fourth Modification)

Figure 16:
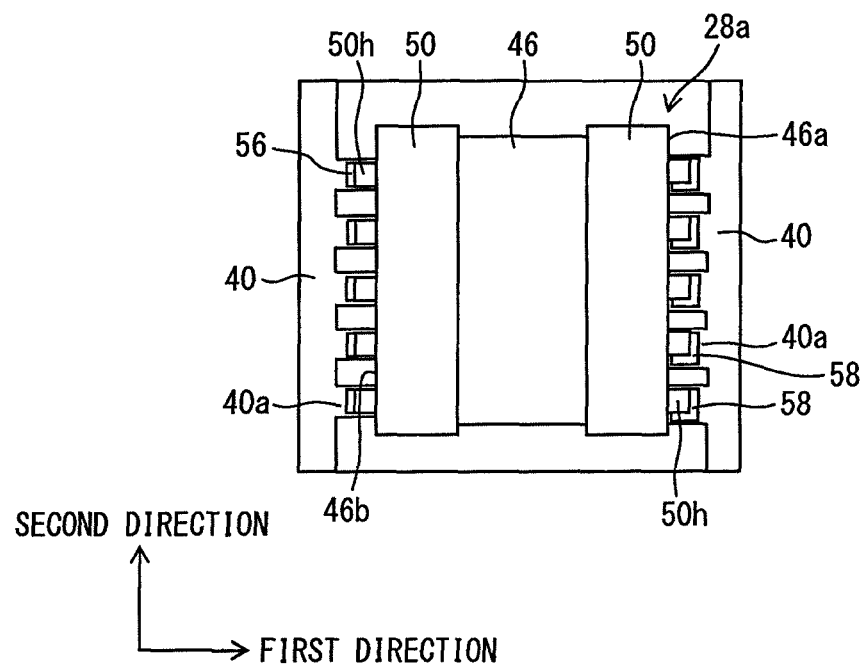
FIG. 16 is a schematic top plan view showing an electronic part according to a fourth modification.

In the above embodiments, one terminal 48 is connected to one electrode 50. However, a number of the terminals 48 to be connected to one electrode 50 should not be limited to one. As shown in FIG. 16, according to the present modification, multiple fuse terminals 56 are connected to one of the electrodes 50, while multiple normal terminals 58 are connected to the other of the electrodes 50, which are respectively arranged at both side surfaces 46b and 46a of the main body 46.

Multiple projections 50h are respectively provided in each of the electrodes 50, wherein a number of the projections 50h corresponds to the number of the terminals 48 and each of the terminals 48 (each of the fuse terminals 56 and each of the normal terminals 58) is connected to each projection 50h. Multiple land arms are branched off from the land 40a, wherein a number of the land arms corresponds to the number of the terminals 48 so that each of the terminals 48 is connected to each land arm. The land arms connected to the same electrode 50 are electrically equivalent to one another. The normal terminals 58 of the first embodiment are used in the present modification.

According to the above structure of the electronic part 28a, when the electronic element of the main body 46 breaks down, the fuse terminals 56 are sequentially melted down depending on a break-down portion and finally all of the fuse terminals 56 connected to the same electrode 50 are melted down. Even in such a case, the main body 46 is held at the position above the board surface by the remaining normal terminals 58, in a condition that each of the fuse terminals 56 connected to the electrode 50 is cut off from the corresponding land arms due to the melt-down of the cut-off portions 60.

In the present modification, it is not always necessary to branch off the land 40a into the multiple land arms. Namely, the multiple terminals 48 may be respectively connected to the same land 40a. In addition, only the fuse terminal may be composed of the multiple fuse terminals 56. Alternatively, only the normal terminal may be composed of the multiple normal terminals 58. The normal terminal 58 of the second and/or third embodiment may be used in the present modification.

(Fifth Modification)

In the above embodiments, the fuse terminal 56 has one cut-off portion 60 or the normal terminal 58 has one land-connected portion 48b.

Figure 17:
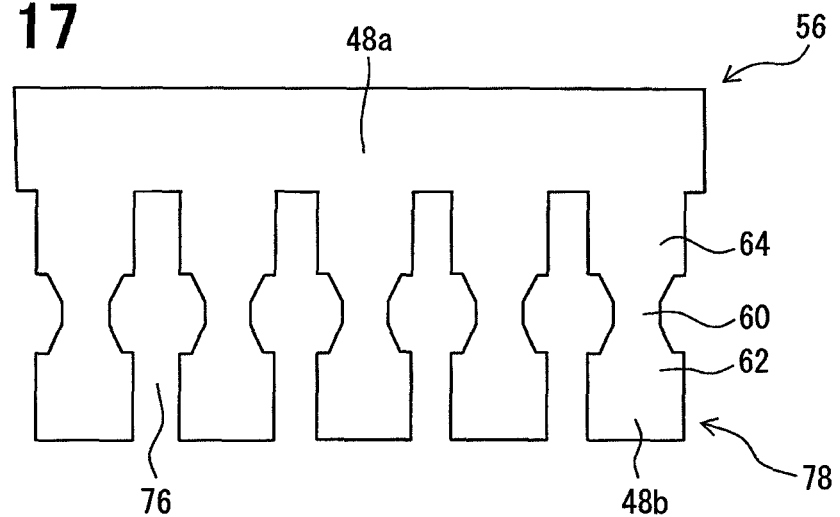
FIG. 17 is a schematic development view showing a structure of a fuse terminal according to a fifth modification.
Figure 18:
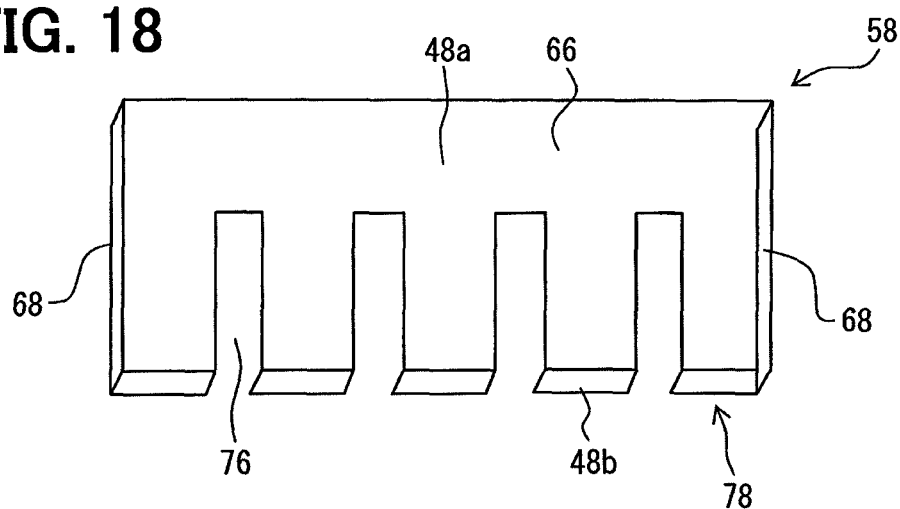
FIG. 18 is a perspective view schematically showing a structure of a normal terminal according to the fifth modification.

However, as shown in FIGS. 17 and 18 of the present modification, one fuse terminal 56 may have multiple cut-off portions 60. In addition, one normal terminal 58 may have multiple land-connected portions 48b.

In FIG. 17, multiple slits 76 are formed in the fuse terminal 56, wherein each of the slits 76 extends from a lower-end side of the land-connected portions 48b toward an opposite side so that multiple leg portions 78 are formed. The multiple cut-off portions 60 are formed in each of the leg portions 78.

In FIG. 18, multiple slits 76 are likewise formed in the normal terminal 58, wherein each of the slits 76 extends from the lower-end side of the land-connected portions 48b to the opposite side so as to form multiple leg portions 78. The multiple land-connected portions 48b are respectively formed in each of the leg portions 78. In other words, one normal terminal 58 has multiple first wall portions 66 which are branched off from an upper portion of the normal terminal 58. The second wall portions 68 are connected to each of outer-most leg portions 78 at both horizontal sides of the normal terminal 58. The normal terminal 58 of the above structure can be applied to the normal terminal 58 of the first and/or third embodiments.

(Sixth Modification)

Figure 19:
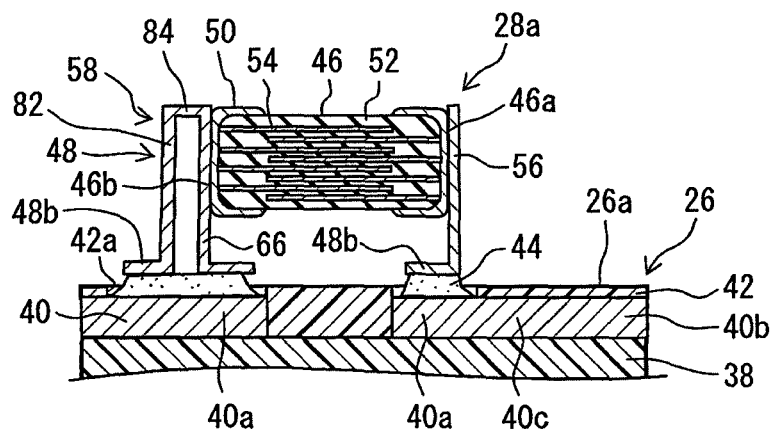
FIG. 19 is a schematic cross sectional view showing an electronic part according to a sixth modification, wherein FIG. 19 corresponds to FIG. 4.

As shown in FIG. 19, according to the present modification, a fifth wall portion 82 is provided in the normal terminal 58 at such a position opposing to the first wall portion 66 in the first direction (in the element-longitudinal direction) and an upper end of the fifth wall portion 82 is connected to an upper end of the first wall portion 66 via a connecting wall portion 84. As shown in FIG. 19, a cross section of the normal terminal 58 has a reversed U-letter shape, wherein the fifth wall portion 82 is bent with respect to the first wall portion 66 at the connecting wall portion 84. A land-connected portion 48b is also formed at a lower end of the fifth wall portion 82. The normal terminal 58 is connected to the corresponding land 40a via the respective land-connected portions 48b of the first and fifth wall portions 66 and 82.

According to the normal terminal 58 of the above structure, the connecting wall portion 84 works as the joist against the vibrational component in the first direction. In addition, the first and fifth wall portions 66 and 82 work as the joists against the vibrational component in the second direction (in the element-width direction). It is, therefore, possible to stably support the main body 46 above the board surface.

(Further Modifications)

In the above embodiments (for example, in the first embodiment), the ceramic-type laminated capacitor is explained as the example for the electronic part 28a. However, the above structures for the electronic part may be applied to any other types of the electronic elements. For example, a laminated inductor may be used as the electronic element having the laminated structure.

In the above embodiments, the terminals 48 (the fuse terminal 56 and the normal terminal 58) are connected to the printed board 26 by the surface mounting technology. The terminals 48 may be alternatively connected to the printed board 26 by a through-hole mounting technology.

In the above embodiments, the electronic part 28a having the fuse terminal 56 is electrically connected to the power-source wiring pattern 40b (connected to the battery 36) via the land 40a and the connecting wiring pattern 40c. However, the electronic part 28a having the fuse terminal 56 may be electrically connected to other wiring patterns than the power-source wiring pattern.

In the above embodiments, the thickness direction of the first wall portion 66 corresponds to the first direction (the direction perpendicular to the second side surface 46b). However, the thickness direction of any other portion of the first wall portion 66, except for the electrode-connected portion 48a, is not limited to the first direction. Furthermore, the thickness direction of the second wall portion 68 is not limited to the second direction (the direction perpendicular to the first direction).

What is claimed is:

1. An electronic part mounted to a printed board comprising:
a main body arranged at a position above and separated from a board surface of the printed board, the main body having at least one electronic element and multiple electrodes for the electronic element; and
multiple terminals respectively connected to each of the electrodes at each one end of the terminals and connected to each of lands formed in the printed board at each other end of the terminals, each of the terminals extending from the main body in a direction to the board surface in order to hold the main body at the position above and separated from the board surface in a condition that each of the terminals is electrically connected to the respective electrodes and the respective lands;
wherein each of the terminals has an electrode-connected portion electrically connected to a corresponding electrode of the main body and a land-connected portion electrically connected to a corresponding land formed in the printed board,
wherein the terminals include at least one fuse terminal and at least one normal terminal,
wherein the fuse terminal has a cut-off portion, which is formed between the electrode-connected portion and the land-connected portion, a width of the cut-off portion is made smaller than a width of other portions of the fuse terminal, the cut-off portion is configured to be melted down depending on heat generated at the cut-off portion due to excess current in order to cut off electrical connection between the corresponding electrode and the land, and
wherein at least one normal terminal holds the main body at the position above and separated from the board surface when at least one fuse terminal cuts off the electrical connection between the corresponding electrode and the land by melt-down of the cut-off portion,
wherein the normal terminal includes:
a first wall portion extending from the land-connected portion to the electrode-connected portion; and
a second wall portion connected to one horizontal side of the first wall portion in a direction parallel to the board surface,
wherein the second wall portion is bent by a predetermined angle with respect to the first wall portion so that a thickness direction of the second wall portion is different from that of the first wall portion, in order that the normal terminal holds by itself the main body at the position above and separated from the board surface when the cut-off portion of the fuse terminal is melted down.

2. The electronic part according to claim 1, wherein
the main body is formed in a rectangular shape on a plane parallel to the board surface of the printed board,
the main body has a first side surface and a second side surface, which are opposed to each other in a direction extending in parallel to the board surface,
the fuse terminal is connected to the electrode formed on the first side surface and the normal terminal is connected to the electrode formed on the second side surface,
a thickness direction of the first wall portion corresponds to a first direction, which is in parallel to the board surface and perpendicular to the second side surface,
a thickness direction of the second wall portion corresponds to a second direction, which is in parallel to the board surface but different from the first direction,
the second wall portion is connected to one side of the first wall portion in the direction parallel to the board surface and perpendicular to the first direction.

3. The electronic part according to claim 2, wherein
the normal terminal has a pair of second wall portions connected to both sides of the first wall portion in the direction parallel to the board surface and perpendicular to the first direction.

4. The electronic part according to claim 1, wherein
the normal terminal has a convex portion connected to the side of the first wall portion in the direction parallel to the board surface and perpendicular to the first direction,
the convex portion outwardly protrudes on a side of an outer surface of the first wall portion, and the convex portion has the second wall portion as a part of the convex portion.

5. The electronic part according to claim 4, wherein the convex portion is composed of;
the second wall portion;
a third wall portion opposing to the second wall portion; and
a fourth wall portion for connecting the second wall portion and the third wall portion to each other.

6. The electronic part according to claim 1, wherein the main body includes a capacitor being composed of dielectric layers and electric conductor layers, which are alternately laminated.

7. An electronic control unit comprising:
the electronic part according to claim 1; and
the printed board having the land connected to the terminal of the electronic part.

8. The electronic control unit according to claim 7, wherein the electronic part is electrically connected to a power-source wiring pattern formed on the printed board via the land.

9. The electronic control unit according to claim 8, wherein the power-source wiring pattern is connected to a battery installed in a vehicle.

10. The electronic part according to claim 1, wherein the terminals include:
one fuse terminal connected to the electrode formed on a first side surface of the main body;
one normal terminal connected to the electrode formed on a second side surface of the main body; and
another normal terminal connected to the electrode formed on the first side surface of the main body.

11. The electronic part according to claim 1, wherein the terminals include:
a first fuse terminal connected to the electrode formed on a first side surface of the main body;
a first normal terminal connected to the electrode formed on a second side surface of the main body; and
a second fuse terminal connected to the electrode formed on the second side surface of the main body; and
a second normal terminal connected to the electrode formed on the first side surface of the main body,
wherein the first and the second normal terminals are diagonally arranged for the main body.

12. The electronic part according to claim 1, wherein the terminals include:
multiple fuse terminals connected to one common wiring pattern; and
multiple normal terminals connected to another common wiring pattern.

13. The electronic part according to claim 1, wherein the fuse terminal has multiple slits to form multiple leg portions,
wherein the cut-off portion is formed in each of the leg portions.

14. The electronic part according to claim 1, wherein the normal terminal has multiple slits to form multiple leg portions,
wherein the land-connected portion is formed in each of the leg portions.

15. An electronic part mounted to a printed board comprising:
a main body arranged at a position above and separated from a board surface of the printed board, the main body having at least one electronic element and multiple electrodes for the electronic element; and
multiple terminals respectively connected to each of the electrodes at each one end of the terminals and connected to each of lands formed in the printed board at each other end of the terminals, each of the terminals extending from the main body in a direction to the board surface in order to hold the main body at the position above and separated from the board surface in a condition that each of the terminals is electrically connected to the respective electrodes and the respective lands;
wherein each of the terminals has an electrode-connected portion electrically connected to a corresponding electrode of the main body and a land-connected portion electrically connected to a corresponding land formed in the printed board,
wherein the terminals include at least one fuse terminal and at least one normal terminal,
wherein the fuse terminal has a cut-off portion, which is formed between the electrode-connected portion and the land-connected portion, a width of the cut-off portion is made smaller than a width of other portions of the fuse terminal, the cut-off portion is configured to be melted down depending on heat generated at the cut-off portion due to excess current in order to cut off electrical connection between the corresponding electrode and the land, and
wherein at least one normal terminal holds the main body at the position above and separated from the board surface when at least one fuse terminal cuts off the electrical connection between the corresponding electrode and the land by melt-down of the cut-off portion,
wherein the normal terminal includes:
a first wall portion extending from the board surface in a vertical direction perpendicular to the board surface;
a fifth wall portion extending from the board surface in the vertical direction, so that the first wall portion and the fifth wall portion extending in parallel to each other; and
a connecting wall portion for connecting the first wall portion and the fifth wall portion to each other at respective upper ends of the first wall portion and the fifth wall portion.

* * * * *